United States Patent
Garza et al.

(10) Patent No.: US 10,534,890 B2
(45) Date of Patent: Jan. 14, 2020

(54) DETECTING PRINTED CIRCUIT BOARD DESIGN VIOLATIONS

(71) Applicant: INTERNATIONAL BUSINESS MACHINES CORPORATION, Armonk, NY (US)

(72) Inventors: Alberto Garza, Edinburg, TX (US); Emile L. Kowalski, Mission, TX (US); Julio A. Maldonado, Austin, TX (US); Jose L. Rodriquez, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 113 days.

(21) Appl. No.: 15/817,809

(22) Filed: Nov. 20, 2017

(65) Prior Publication Data

US 2019/0155982 A1 May 23, 2019

(51) Int. Cl.
*G06F 17/50* (2006.01)
*H05K 3/00* (2006.01)

(52) U.S. Cl.
CPC ....... *G06F 17/5081* (2013.01); *H05K 3/0005* (2013.01)

(58) Field of Classification Search
CPC .......................... H05K 3/0005; G06F 17/5081
USPC ................................................. 716/111, 136
See application file for complete search history.

(56) References Cited

U.S. PATENT DOCUMENTS

| | | | |
|---|---|---|---|
| 6,433,286 B1 * | 8/2002 | Doberenz | H05K 1/0224 174/261 |
| 6,658,732 B2 * | 12/2003 | Doberenz | H05K 1/0224 29/846 |
| 6,842,344 B1 * | 1/2005 | Fix et al. | H05K 1/0216 174/255 |
| 6,971,081 B2 * | 11/2005 | Ramakrishnan | G06F 17/5077 257/700 |
| 7,240,309 B2 | 7/2007 | Saito et al. | |
| 7,518,884 B2 * | 4/2009 | Wright | H05K 1/0224 361/780 |
| 7,746,661 B2 * | 6/2010 | Liao et al. | H05K 1/111 361/777 |
| 7,849,427 B2 | 12/2010 | Christo et al. | |
| 2008/0109773 A1 * | 5/2008 | Douriet | G06F 17/5036 716/115 |
| 2012/0174052 A1 | 7/2012 | Mathur | |

(Continued)

*Primary Examiner* — Sun J Lin
(74) *Attorney, Agent, or Firm* — Kunzler Bean & Adamson, PC; Bruce R. Needham

(57) ABSTRACT

An apparatus for detecting printed circuit board ("PCB") design violations includes an analysis module that analyzes a position of a trace on a PCB design to determine conductivity of a design material over which the trace is being added and/or an electrical property of the trace at the position. The apparatus further includes an identification module that identifies, in real time, a void violation on the PCB design in response to the design material including a non-conductive material and/or a reference voltage violation on the PCB design in response to the position including a voltage and a notification module that notifies a user of the void violation and/or the reference voltage violation. At least a portion of said modules include hardware circuits, a programmable hardware device, and/or executable code stored on one or more non-transitory computer-readable storage media.

18 Claims, 7 Drawing Sheets

(56) References Cited

U.S. PATENT DOCUMENTS

| | | |
|---|---|---|
| 2014/0033146 A1 | 1/2014 | Chun et al. |
| 2016/0370421 A1 | 12/2016 | Bonilla et al. |
| 2018/0025106 A1* | 1/2018 | Chobanyan et al. ........................ G06F 17/5081 716/112 |

\* cited by examiner

DETECTING PRINTED CIRCUIT BOARD DESIGN VIOLATIONS

FIELD

The subject matter disclosed herein relates to printed circuit boards ("PCBs") and more particularly relates to methods and systems for detecting PCB design violations.

BACKGROUND

Printed circuit boards ("PCBs") are commonly used in computing devices. Contemporary PCBs can include several layers separated by voids (e.g., by air, glass, and/or another non-conductive material). Some layers include a reference voltage and other layers include traces. Some designs include alternating trace or bus layers and layers with reference voltages.

Currently, PCBs are designed and prototypes are built prior to determining whether there are flaws in the design. That is, design flaws are typically discovered after a prototype is built and tested. As such, after a flaw is detected in a particular design prototype, a human is typically responsible for discovering/determining the flaw and making design changes to correct the flaw. Discovering/determining design flaws and making design changes after a prototype is built and tested can be costly and/or inefficient in terms of time, material, labor, and/or other resources.

BRIEF SUMMARY

An apparatus for detecting printed circuit board ("PCB") design violations includes an analysis module that analyzes a position of a trace on a PCB design to determine conductivity of a design material over which the trace is being added and/or an electrical property of the trace at the position. The apparatus further includes an identification module that identifies, in real time, a void violation on the PCB design in response to the design material including a non-conductive material and/or a reference voltage violation on the PCB design in response to the position including a voltage and a notification module that notifies a user of the void violation and/or the reference voltage violation. At least a portion of said modules include hardware circuits, a programmable hardware device, and/or executable code stored on one or more computer-readable storage media.

A method for detecting PCB design violations includes analyzing, by a processor, a position of a trace on a PCB design to determine one of a conductivity of a design material over which the trace is being added and an electrical property of the trace at the position. The method further includes identifying, in real time, a void violation on the PCB design in response to the design material including a non-conductive material and/or a reference voltage violation on the PCB design in response to the position including a voltage and notifying a user of the at least one of the void violation and the reference voltage violation.

A system for detecting PCB design violations includes a client device configured to enable a user to create a PCB design and a server coupled to the client device. The server includes an analysis module that analyzes a position of a trace on the PCB design to determine one of a conductivity of a design material over which the trace is being added and an electrical property of the trace at the position, an identification module that identifies, in real time, a void violation on the PCB design in response to the design material including a non-conductive material and/or a reference voltage violation on the PCB design in response to the position including a voltage, and a notification module that notifies the user of the void violation and/or the reference voltage violation.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Figure 1:
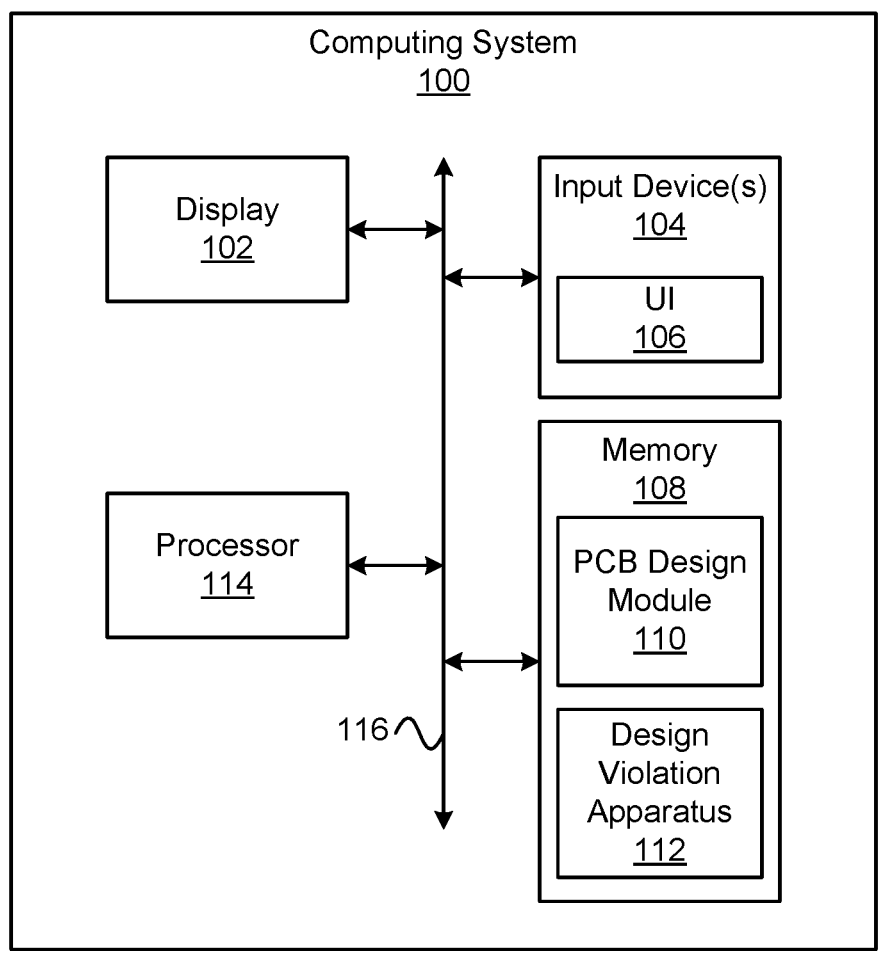
FIG. 1 is a schematic block diagram illustrating one embodiment of a computing system for detecting a PCB design violation on a PCB design.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program instructions may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

Apparatus, methods, and systems for detecting printed circuit board (PCB) design violations are disclosed. An apparatus for detecting PCB design violations includes an analysis module that analyzes a position of a trace on a PCB design to determine conductivity of a design material over which the trace is being added and/or an electrical property of the trace at the position. The apparatus further includes an identification module that identifies, in real time, a void violation on the PCB design in response to the design material including a non-conductive material and/or a reference voltage violation on the PCB design in response to the position including a voltage and a notification module that notifies a user of the void violation and/or the reference voltage violation. At least a portion of said modules include hardware circuits, a programmable hardware device, and/or executable code stored on one or more computer-readable storage media.

The apparatus, in some embodiments, further includes a tracking module that tracks a path of the trace in real time while the cursor is adding the trace to enable the analysis module to determine the position of the trace. In additional or alternative embodiments, the tracking module tracks a path of the trace subsequent to one of a first voltage layer including a reference voltage being added to the PCB design and a reference voltage being assigned to a second voltage layer in which the analyzed position is on the path of the trace, the electrical property at the analyzed position is a voltage presence, and the identification module identifies the reference voltage violation in response to the analysis module detecting the presence of the reference voltage at the analyzed position. In further alternative or additional embodiments, the tracking module tracks a path of the trace subsequent to one of the design material being added to the PCB design and a conductive property being assigned to the design material in which the analyzed position is on the path of the trace, the electrical property at the analyzed position includes electrical conductivity, and the identification module identifies the void violation in response to the analysis module detecting that the design material is non-conductive at the analyzed position.

In various embodiments, the position is analyzed in real time while the cursor is adding the trace to the PCB design, the PCB design includes a plurality of layers and one or more voids in which a void separates each respective pair of layers on the PCB design, and the analysis module analyzes the position of the trace with respect to at least one of a pair of layers that are adjacent to the position of the trace and the one or more voids. In some embodiments, the position is a three-dimensional (3D) location on the PCB design. In further embodiments, one of the layers, in its entirety, includes a Z coordinate in the 3D location and an X-Y coordinate at the 3D location is determined with respect to all of the plurality of layers.

In various embodiments, the position is analyzed in real time while the cursor is adding the trace to the PCB design. In some embodiments, the PCB design includes a set of voids, and the identification module identifies the void violation in response to the analysis module analyzing the position of the trace to determine that the trace is located in a void. In additional or alternative embodiments, the PCB design includes a first layer including a reference voltage, a second layer including a set of traces, and a void separating the first layer and the second layer, and the identification module identifies the void violation in response to the analysis module analyzing the position of the trace to determine that the trace is located in the void. In further additional or alternative embodiments, the PCB design includes a plurality of layers, one or more of the plurality of layers includes a reference voltage, and the identification module identifies the reference voltage violation in response to the analysis module analyzing the position of the trace to determine that the position includes a same voltage as an adjacent layer on the PCB design.

In still further additional or alternative embodiments, the PCB design include a first layer including a first reference voltage, a second layer including a second reference voltage, and a third layer between the first layer and the second layer, the third layer including a set of traces, the position of the trace is located on the third layer, the analysis module analyzes the position to determine that the position includes one of the first reference voltage and the second reference voltage, and the identification module identifies the reference voltage violation in response to the determination. In yet further additional or alternative embodiments, the PCB design includes a first layer including a first reference voltage, a second layer including a second reference voltage, and a third layer between the first layer and the second layer, the third layer including a set of traces, the position of the trace is located on one of the first layer and the second layer, the analysis module analyzes the position to determine that the position includes one of the first reference voltage and the second reference voltage, and the identification module identifies the reference voltage violation in response to the determination.

A method for detecting PCB design violations includes analyzing, by a processor, a position of a trace on a PCB design to determine one of a conductivity of a design material over which the trace is being added and an electrical property of the trace at the position. The method further includes identifying, in real time, a void violation on the PCB design in response to the design material including a non-conductive material and/or a reference voltage violation on the PCB design in response to the position including a voltage and notifying a user of the at least one of the void violation and the reference voltage violation.

In some embodiments, the method further includes tracking a path of the trace in real time while the cursor is adding the trace to determine the position of the trace. In additional or alternative embodiments, the method further includes tracking a path of the trace subsequent to one of a first voltage layer including a reference voltage being added to the PCB design and a reference voltage being assigned to a second voltage layer in which the analyzed position is on the path of the trace, the electrical property at the analyzed position is a reference voltage presence, and the reference voltage violation is identified in response to detecting the presence of the reference voltage at the analyzed position. In further additional or alternative embodiments, the method further includes tracking a path of the trace subsequent to one of the design material being added to the PCB design and a conductive property being assigned to the design material in which the analyzed position is on the path of the trace, the electrical property at the analyzed position includes electrical conductivity, and the void violation is identified in response to detecting that the design material is non-conductive at the analyzed position.

In some embodiments, the PCB design includes a set of voids and the void violation is identified in response to determining that the position of the trace is in a void. In additional or alternative embodiments, the PCB design includes a plurality of layers, a set of layers of the plurality of layers include a reference voltage, and the reference voltage violation is identified in response to determining that the position of the trace includes the reference voltage of an adjacent layer. In further additional or alternative embodiments, the PCB design includes a voltage layer including a reference voltage, the position of the trace is on the voltage layer, and the reference voltage violation is identified in response to determining that the position of the trace includes the reference voltage.

A system for detecting PCB design violations includes a client device configured to enable a user to create a PCB design and a server coupled to the client device. The server includes an analysis module that analyzes a position of a trace on the PCB design to determine one of a conductivity of a design material over which the trace is being added and an electrical property of the trace at the position, an identification module that identifies, in real time, a void violation on the PCB design in response to the design material including a non-conductive material and/or a reference voltage violation on the PCB design in response to the position including a voltage, and a notification module that notifies the user of the void violation and/or the reference voltage violation.

The description of elements in each figure below may refer to elements of proceeding figures. Like numbers refer to like elements in all figures, including alternate embodiments of like elements.

FIG. 1 is a block diagram illustrating one embodiment of a computing system 100 for detecting PCB design violations on a PCB design during the design of a PCB. A computing system 100 may include any suitable apparatus, components, hardware and/or software that can create and/or generate a design for a PCB and detect PCB design violations in the PCB design in real time (e.g., while the PCB is being designed). At least in the illustrated embodiment, a computing system 100 includes, among other components, a display 102, one or more input devices 104 including a user interface ("UI") 106, a memory 108 storing, among other components, a PCB design module 110 and a design violation apparatus 112, and a processor 114 coupled to and in communication with one other via a bus 116 (e.g., a wired and/or wireless bus).

A display 102 may be any suitable apparatus and/or system that is known or developed in the future capable of displaying data and/or information to a user. In various embodiments, the display 102 includes a computer monitor, among other types of visual and/or audio display apparatus and/or systems that are possible and contemplated herein. In one embodiment, the display 102 includes a touchscreen and/or other similar UI that is/are known or developed in the future capable of displaying data/information and receiving inputs from a human and/or automated user.

The input device(s) 104 may be any suitable apparatus and/or system that is known or developed in the future capable of receiving inputs from a human and/or automated user. Non-limiting examples of an input device 104 include, but are not limited to, a computer mouse, a keyboard, a touch screen, a stylus, a trackball, a joystick, a light pen, and/or a microphone, etc., among other apparatus/systems that are possible and contemplated herein.

In various embodiments, a display 102 and the input device(s) 104 operate in conjunction with one another to receive and display user inputs utilizing any suitable UI 106 that is known or developed in the future. Non-limiting examples of a UI 106 include, but are not limited to, a graphical user interface ("GUI"), a command line interface ("CLI"), a menu-driven interface, a formed-based interface, a natural language interface, and/or a gesture-driven interface, etc., among other types of UIs that are possible and contemplated herein.

In various embodiments, the input device(s) 104 and UI 106 operate in conjunction with one another to create/generate a PCB design using the computing system 100. That is, the input device(s) 104 and UI 106 receive user inputs, in response thereto, modify (e.g., insert, add, delete, move, relocate, etc.) one or more components, portions, dimensions, and/or characteristics, etc. of a PCB design in response thereto. For example, the input device(s) 104 and UI 106 can operate in conjunction with one another to modify one or more traces, one or more buses, one or more voids, and/or reference voltages on the design of a PCB in response to receiving user inputs.

The position of an input device 104 may be shown using any suitable type of visual, audible, and/or tactile indicator that can allow a user to determine the position of an UI. In various embodiments, a display 102 and the input device(s) 104 use a cursor to show the position of a UI 106, among other types of mobile position indicators that are possible and contemplated herein.

Memory 108 may be any suitable type of non-transitory and/or persistent apparatus, device, and/or system that can contain, store, communicate, propagate, and/or transport instructions, data, computer programs, software, code, routines, etc., for processing by or in connection with an instruction/operation execution and/or processing device (e.g., a processor 114, a hardware processor, a hardware/software processor, etc.). For instance, a memory 108 may include, but is not limited to, an electronic storage device, a magnetic storage device, an optical storage device, an electromagnetic storage device, a semiconductor storage device, or any suitable combination of the foregoing, among other tangible types of storage mediums that are possible and contemplated herein.

Other non-limiting examples of memory 108 include a hard disk, a blade, a portable computer diskette, a random access memory ("RAM") device, a read-only memory ("ROM") device, an erasable programmable read-only memory ("EPROM" or Flash memory) device, a static random access memory ("SRAM") device, a portable compact disc read-only memory ("CD-ROM"), a digital versatile disk ("DVD"), a memory stick, a floppy disk, a mechanically encoded device such as punch-cards or raised structures in a groove having instructions recorded thereon, a tape drive, and/or any suitable combination of the foregoing, among other types of device that are possible and contemplated herein. As used herein, a memory 108 is not to be construed as being transitory signals per se, such as, for example, radio waves or other freely propagating electromagnetic waves, electromagnetic waves propagating through a waveguide or other transmission media (e.g., light pulses passing through a fiber-optic cable), or electrical signals transmitted through a wire, and/or the like waves/signals.

In some embodiments, a memory 108 can store a PCB design module 110. A PCB design module 110 may be any hardware and/or software that is known or developed in in the future that can allow a user to design a PCB (e.g., create/generate a PCB design). In various embodiments, the PCB design module 110 includes computer-readable instructions that allow a user to a create and/or generate a PCB design (e.g., utilizing a processor 114). As used herein, the terms "design of a PCB" and/or "PCB design" can include and/or refer to an electronic representation of a PCB during its design and/or while a PCB is being designed, which can also be considered a virtual PCB and/or virtual PCB design.

A design violation apparatus 112 may include any suitable hardware and/or software that can detect design violations in a PCB design. In various embodiments, a design violation apparatus 112 can detect void violations and/or reference voltage violations, although other design violations may be detectable.

Figure 2A:
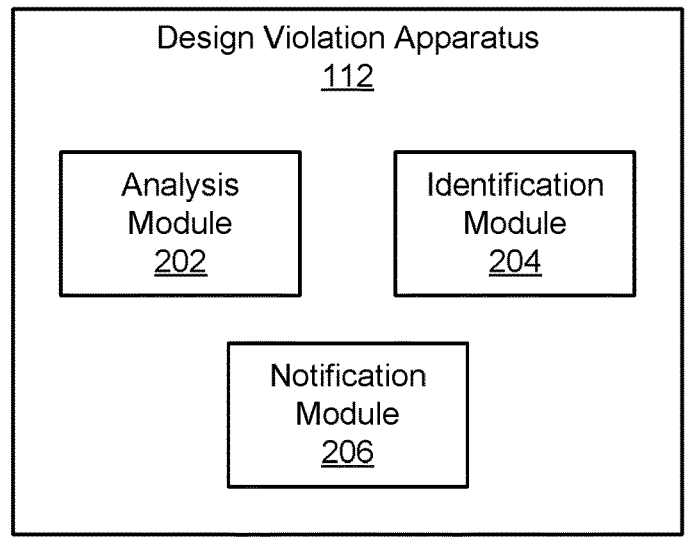
FIG. 2A is a schematic block diagram illustrating one embodiment of a design violation apparatus included in the computing system of FIG. 1.

With reference to FIG. 2A, one embodiment of a design violation apparatus 112 is illustrated. At least in the embodiment illustrated in FIG. 2A, a design violation apparatus 112 includes, among other components and/or modules, an analysis module 202, an identification module 204, and a notification module 206.

An analysis module 202 may include any suitable hardware and/or software that can analyze a PCB design at the current position of an input device 104 (e.g., the current position of a cursor). In various embodiments, an analysis module 202 can analyze the position of the cursor on a PCB design to determine and/or detect one or more characteristics of the PCB design where a cursor is currently positioned/located. Example characteristics include, but are not limited to, voltage, current, resistance, conductivity, design material, and/or lack of design material (e.g., air), etc., among other characteristics that can provide the basis for identifying and/or determining a design violation in a PCB design.

For example, the analysis module 202 can determine the position of a trace being added to a PCB design (e.g., via the cursor position) in relation to the location of one or more voltage layers, one or more other traces, one or more buses, one or more voids, and/or in relation to one or more other components on the PCB design. Further, the analysis module 202 can determine one or more electrical properties and/or electrical characteristics (e.g., voltage, current, conductivity, and/or resistance, etc.) of the voltage layer(s), other trace(s), bus/buses, void(s), and/or other component(s), etc. at and/or proximate to the trace begin added to the PCB design, which can provide the basis for detecting, determining, and/or identifying a reference voltage violation and/or void violation in the PCB design.

A reference voltage violation, for example, can occur when a trace being added to a PCB design is added to a voltage layer, is added to a trace layer within a predetermined distance of a voltage layer, and/or is added within a predetermined distance of another trace and/or bus, each of which can result in the added trace including an electrical property and/or characteristic that it should not include (e.g., includes the reference voltage of a voltage layer). The voltage, current, conductivity, and/or resistance, etc. at the current position of a cursor on a PCB design may be determined/detected/identified in any suitable manner and/or using any suitable technique that is known or developed in the future. In some embodiments, the voltage, current, and/or resistance, etc. at a position of a cursor on the PCB design may be determined in real time while a PCB is being designed.

In another non-limiting example, a void violation can occur when a trace being added to a PCB design is added over a void, over a border or boundary separating a voltage layer and a trace layer, and/or over a material that does not include an electrical property (e.g., a non-conductive material), each of which can be based on the conductive or non-conductive property of the design material over which the trace is being added. In other words, a void violation can occur when the position where a trace is being added to a PCB design is over a design material that does not include a conductive property and/or is a non-conductive material.

An analysis module 202 can determine/detect/identify the presence of a void (e.g., the lack of design material and/or air) using any suitable technique that is known or developed in the future. Further, the conductivity of a material included in the design of a PCB may be determined/detected/identified by the analysis module 202 using any suitable technique that is known or developed in the future that can identify the electrical properties of the design material at the current position of a cursor on the PCB design. In some embodiments, an analysis module 202 may include and/or reference a table of electrical properties of various design material(s) that may be used in a PCB design to determine the conductivity of the particular design material(s) at the current position of the cursor on the PCB design. For instance, in response to determining that the design material at the current position of the cursor on the PCB design is glass, an analysis module 202 can reference a table to determine that the design material at the position where the cursor is currently located one the PCB design is non-conductive based on the information related to glass in the table.

In additional or alternative embodiments, an analysis module 202 may be able to identify the design material(s) at the current position of the cursor on the PCB design and deduce the conductivity of the design material(s) based on the properties of the design material itself. For example, in response to detecting that the design material at the current position of the cursor on the PCB design is glass, an analysis module 202 can automatically determine that the design material where the cursor is currently located on the PCB design is non-conductive.

In further additional or alternative embodiments, an analysis module 202 can analyze one or more of the traces and/or buses on a PCB design to determine and/or detect one or more characteristics of the trace(s) and/or bus/buses on a PCB design subsequent to one or more reference voltages being added to a voltage layer on a PCB design. For example, traces and/or buses can be added to a trace layer and/or a trace layer may be added to a PCB design prior to adding a voltage layer to the PCB design and/or prior to a reference voltage being assigned to a voltage layer that is adjacent to the trace layer, which can make it difficult to determine/detect/identify a reference voltage violation at the time(s) that the trace(s), bus/buses, and/or trace layer(s) is/are added to the PCB design. In this example, in response to a user adding a reference voltage to a voltage layer and/or adding a voltage layer including a reference voltage that is/are adjacent to one or more trace layers, an analysis module 202 can analyze each trace and/or bus on the trace layer(s) that are adjacent to the voltage layer(s) and determine/detect/identify the positional relationship of the trace(s) and/or bus/buses to the location of the voltage layer(s), one or more other traces, one or more buses, one or more voids, and/or one or more other components on the PCB design and/or can determine/detect/identify any electrical properties and/or characteristics along the path of each trace and/or bus, which can be used as the basis for determining, detecting, and/or identifying a reference voltage violation.

In other additional or alternative embodiments, an analysis module 202 can analyze one or more of the traces and/or buses on a PCB design to determine and/or detect one or more characteristics of the trace(s) and/or bus/buses subsequent to one or more design materials being added to a PCB design. For example, traces and/or buses may be added to a trace layer and/or a trace layer may be added to a PCB design prior to a void, boundary, voltage layer, and/or other conductive material being added to the PCB design, which can make it difficult to determine/detect/identify a void violation at the time(s) that the trace(s), bus/buses, and/or trace layer(s) is/are added to the PCB design. In this example, in response to the addition of a void, boundary, voltage layer, and/or other conductive material to the PCB design that is adjacent to one or more trace layers, an analysis module 202 can analyze each trace and/or bus on the trace layer(s) that are adjacent to the void, boundary, voltage layer, and/or other conductive material added to the PCB design and determine/detect/identify one or more traces and/or bus/buses being routed over a gap (e.g., air), void, or non-conductive design material, which can be used as the basis for determining, detecting, and/or identifying a void violation.

An identification module 204 may include any suitable hardware and/or software that can identify and/or determine a design violation (e.g., a void violation and/or reference voltage violation) based on the one or more characteristics determined/detected/identified in an analysis performed by an analysis module 202. In some embodiments, an identification module 204 can be included as a portion of an analysis module 202. In further embodiments, at least a portion of an identification module 204 can be included in an analysis module 202.

In some embodiments, an identification module 204 can identify/determine a void violation in response to a cursor being located at a void between two layers of a PCB design. A void can be identified and/or detected in response to determining/detecting/identifying a non-conductive material and/or a material with minimal or no conductive property (e.g., air) at the current position/location of a cursor on the PCB design. For example, in response to an analysis module 202 determining/detecting/identifying that the material at the current position where a cursor is adding a trace and/or bus to a PCB design is non-conductive, an identification module 204 can determine that the cursor is adding the trace over a void and identify a void violation based thereon. In some embodiments, a void violation is identified in real time during the creation of a PCB design (e.g., when a PCB design is being generated).

In further additional or alternative embodiments, an identification module 204 can identify/determine a void violation in response to a trace being positioned over a non-conductive material subsequent to adding the non-conductive material to the PCB design. A void can be identified and/or detected in response to determining/detecting/identifying a non-conductive material and/or a material with minimal or no voltage property being added beneath a trace and/or bus on the PCB design. For example, in response to an analysis module 202 determining/detecting/identifying that a newly added design material over which a trace and/or bus is positioned/routed on a PCB design is non-conductive, an identification module 204 can determine that the trace and/or bus is positioned and/or routed over a void and identify/determine a void violation based thereon.

In some additional or alternative embodiments, an identification module 204 can identify/determine a reference voltage violation in response to cursor being located at a location of a PCB design that includes an electrical property and/or characteristic (e.g., a voltage) that is not supposed to include a reference voltage (e.g., a point on a trace layer including a reference voltage). For instance, a reference voltage violation may be identified/determined in response to a cursor adding a trace and/or bus to the PCB design and the cursor is currently located on a voltage layer and/or is located within a predetermined distance of a voltage layer, a trace, another trace, a bus, another bus, a void, and/or other component on the PCB design that causes the trace and/or bus to include an electrical property or characteristic when the trace and/or bus should not include such electrical property or characteristic on the trace layer. For example, in a PCB design in which a trace layer is located adjacent to and between two voltage layers including respective reference voltages, an identification module 204 can identify/determine a reference voltage violation in response to an analysis module 202 determining/detecting/identifying that a voltage is present at the current location of a cursor that is adding a trace and/or bus to the PCB design. In some embodiments, a reference voltage violation can be identified in real time during the creation of a PCB design (e.g., when a PCB design is being generated).

In other additional or alternative embodiments, an identification module 204 can identify/determine a reference voltage violation subsequent to adding a reference voltage to a voltage layer and/or adding a voltage layer including a reference voltage to the PCB design. Here, the reference voltage violation can be identified/determined in response to the position and/or route of a trace and/or bus including an electrical property or characteristic when the position should not include such electrical property or characteristic on the trace layer.

For example, an identification module 204 can identify/determine that a reference violation exists at one or more location(s) along the route/path of a trace and/or bus subsequent to a reference voltage being added to a voltage layer and/or a voltage layer including a reference voltage being added to a PCB design in response to an analysis module 202 determining/detecting that a trace or bus is positioned at and/or routed through a voltage layer and/or is positioned at and/or is routed within a predetermined distance of a voltage layer, a trace, another trace, a bus, another bus, a void, and/or other component on the PCB design that cause the position and/or route to include an electrical property or characteristic that should not exist at the location and/or along the route on the trace layer.

A notification module 206 can include any suitable hardware and/or software that can notify a user of a design violation. A notification may include any suitable visual, audible, and/or tactile notification that can inform a user that a void violation and/or reference voltage violation exists.

In some embodiments, the notification can inform the user of the type of design violation (e.g., a void violation and/or reference violation). In additional or alternative embodiments, the notification can inform the user of the location of the design violation (e.g., in two or three dimensions, as discussed elsewhere herein).

Figure 2B:
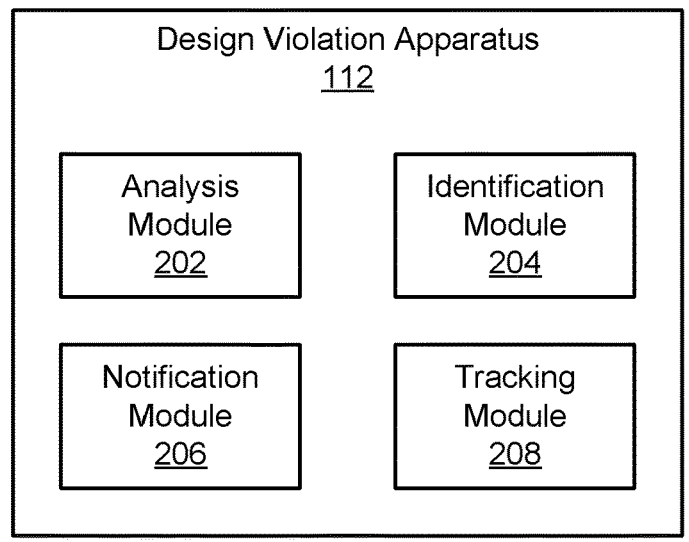
FIG. 2B is a schematic block diagram illustrating another embodiment of a design violation apparatus included in the computing system of FIG. 1.

Referring to FIG. 2B, another embodiment of a design violation apparatus 112 is illustrated. At least in the embodiment illustrated in FIG. 2B, the design violation apparatus 112 includes, among other components and/or modules, an analysis module 202, an identification module 204, and a notification module 206 similar to the design violation apparatus 112 discussed with reference to FIG. 2A. The design violation apparatus 112 illustrated in FIG. 2B, in various embodiments, further includes a tracking module 208.

A tracking module 208 can include any suitable hardware and/or software that can track a trace and/or bus as a cursor adds the trace and/or bus to a PCB design to assist in determining the position of a UI 106 so that an analysis module 202 can analyze the positions of the trace and/or bus as the trace/bus is being added to the PCB design, which can allow an identification module 204 to identify/determine a design violation based on the analysis performed thereon. In some embodiments, a tracking module 208 can follow the trace/bus as it is added to a PCB design and/or changes positions on the PCB design. In additional or alternative embodiments, a tracking module 208 can determine and/or track the addition of the trace and/or bus in real time while a cursor is adding the trace and/or bus to a PCB design during the creation of the PCB design (e.g., when the PCB design is being generated).

In further additional or alternative embodiments, a tracking module 208 can track and/or determine the position(s) and/or route of a trace and/or a bus on a PCB design after the trace and/or bus is added to the PCB design so that an analysis module 202 can analyze the various positions of the trace and/or bus. For example, a tracking module 208 can track the route of a trace and/or bus on a trace layer subsequent to a voltage layer including a reference voltage being added to a PCB and/or subsequent to a reference voltage being added to a voltage layer that is adjacent to the trace layer so that an analysis module 202 can analyze the position(s) and/or route(s) of the trace(s) and/or bus/buses, which can allow an identification module 204 to identify/determine a reference voltage violation based on the analysis performed thereon.

In another non-limiting example, a tracking module 208 can track the route of a trace and/or bus on a trace layer subsequent to a design material being added to a PCB and/or subsequent to a conductive value being added to a design material that is adjacent to the trace layer so that an analysis module 202 can analyze the position(s) and/or route(s) of the trace(s) and/or bus/buses for conductivity and/or non-conductivity of the design material, which can allow an identification module 204 to identify/determine a void violation based on the analysis performed thereon.

The position(s) of a trace and/or bus may be tracked and/or determined using any suitable technique and/or mechanism that is known or developed in the future. Further, the route or path of a trace and/or bus may be tracked and/or determined using any suitable technique and/or mechanism that is known or developed in the future. In some embodiments, a tracking module 208 can track and/or determine the position of a trace, bus, and/or the route/path of a trace and/or bus in three dimensions.

In one embodiment, a tracking module 208 can track a trace, bus, and/or trace/bus route on an X-axis, a Y-axis, and a Z-axis with respect to all of the layers of a PCB design. In another embodiment, a tracking module 208 can track the positions of a trace/bus and/or trace/bus route on an X-axis and a Y-axis with respect to all of the layers of a PCB design and a Z-axis with respect to a particular layer, in its entirety, of the PCB design. Here, the entire thickness of the particular layer may be considered a single point on the Z-axis.

A processor 114 may include any suitable hardware and/or software that can execute instructions for designing a PCB and/or performing a method for detecting PCB design violations during the design of a PCB. In some embodiments, a processor 114 can be a specialized and/or dedicated device or system that includes firmware that can detect PCB design violations during design of a PCB. In additional or alternative embodiments, a processor 114 can include at least a portion of a design violation apparatus 112, an analysis module 202, an identification module 204, a notification module 206, and/or a tracking module 208.

Figure 3:
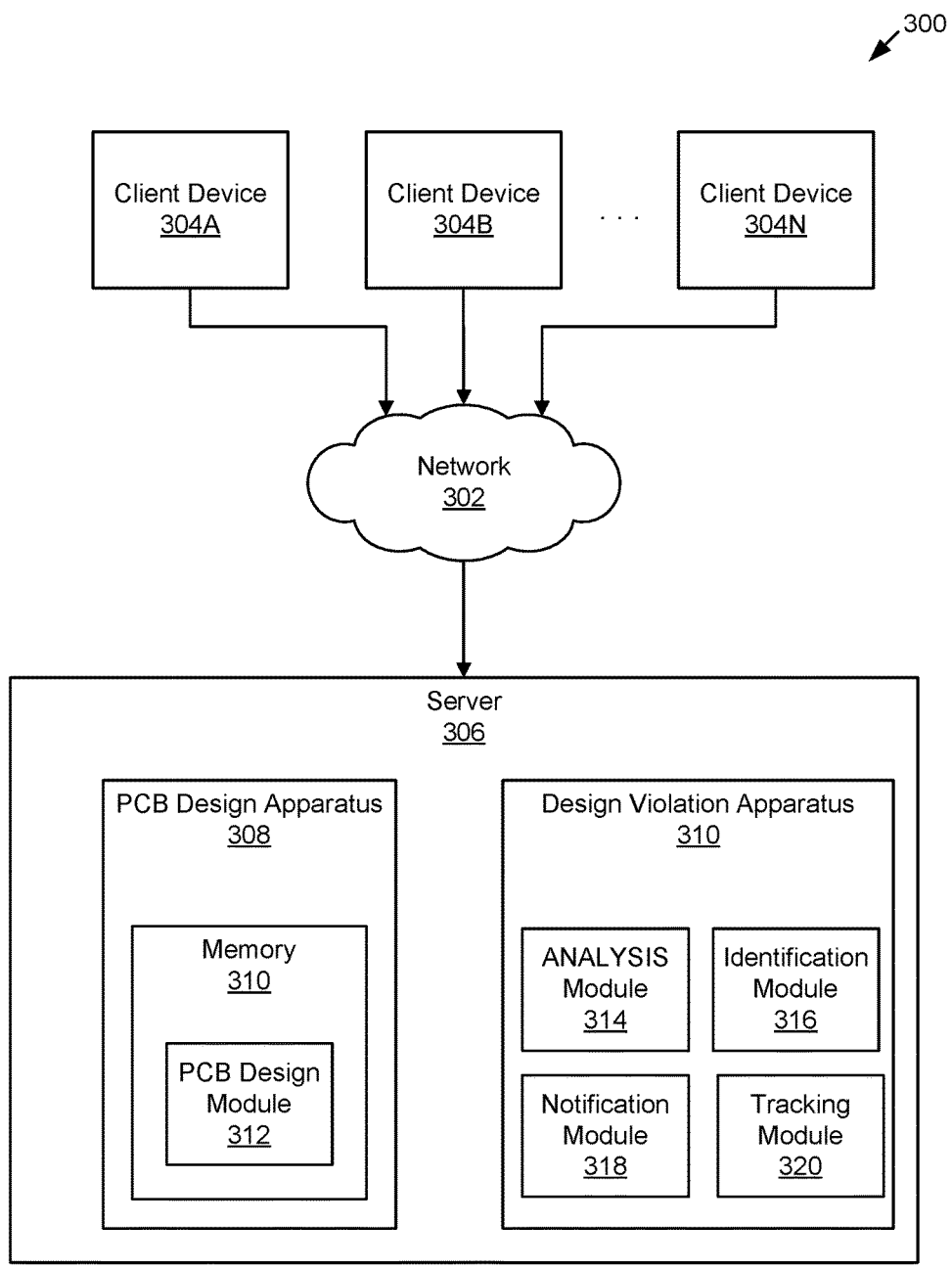
FIG. 3 is a schematic block diagram of one embodiment of a computing network for detecting a PCB design violation on a PCB design.

FIG. 3 is a schematic block diagram illustrating one embodiment of a computing network 300 for designing a PCB. At least in the illustrated embodiment, the computing network 300 includes, among other components, a network 302 coupling one or more client devices 304 and a server 306 including a PCB design apparatus 308 and a design violation apparatus 310 to one another.

A network 302 may be any wired and/or wireless network 302 (e.g., public and/or private computer networks in any number and/or configuration (e.g., the Internet, an intranet, a cloud network, etc.)) that is known or developed in the future that enables and/or allows one or more client devices 304 to be coupled to and/or in communication with the PCB design system 306 and the design violation system 308. In various embodiments, the network 302 can include a cloud network ("IAN"), a "SAN" (e.g., a storage area network, a small area network, a server area network, and/or a system area network), a wide area network ("WAN"), a local area network ("LAN"), a wireless local area network ("WLAN"), a metropolitan area network ("MAN"), an enterprise private network ("EPN"), a virtual private network ("VPN"), and/or a personal area network ("PAN"), among other examples of computing networks and/or or sets of computing devices connected together for the purpose of sharing resources.

A client device 304 can be any computing hardware and/or software (e.g., a thick client, a thin client, or hybrid thereof) that is known or developed in the future that is/are capable of accessing the server 306 via the network 302. A client device 304, as part of its respective operation, may rely on sending input/output (I/O) requests to the server 306 to write data, read data, and/or modify data, etc. For instance, a client device 304 can transmit I/O requests to write, read, store, communicate, propagate, and/or transport instructions, data, computer programs, software, code, routines, etc., to the server 306. Further, a client device 304 can receive notifications from the server 306 (e.g., the design violation apparatus 310) informing a user that a PCB design includes a design violation (e.g., a void violation and/or reference voltage violation).

In various embodiments, a client device 304 may include any suitable computing device and may further form at least a portion of a computing node in a network. While FIG. 3 depicts the computing network 300 as including three client devices 304, other embodiments may include one client device 304, two client devices 304, or more than three client devices 304 such that the various embodiments of the computing network 300 are not limited to three client devices 304.

A PCB design apparatus 306 may include, among other components, a memory 310 that can store a PCB design module 312 similar to the memory 108 storing the PCB design module 110 discussed elsewhere herein. That is, the PCB design module 312 may be any hardware and/or software that is known or developed in in the future that can allow a user to create a PCB design. In various embodiments, the PCB design module 312 includes computer-readable instructions that allow a user to a create/generate a PCB design via a client device 304.

In various embodiments, a design violation apparatus 308 includes, among other components, an analysis module 314, an identification module 316, and a notification module 318 similar to the analysis module 202, the identification module 204, and the notification module 206, respectively, discussed elsewhere herein. In some embodiments, a design violation apparatus 308 can further include a tracking module 320 similar to the tracking module 208 discussed elsewhere herein.

Figure 4:
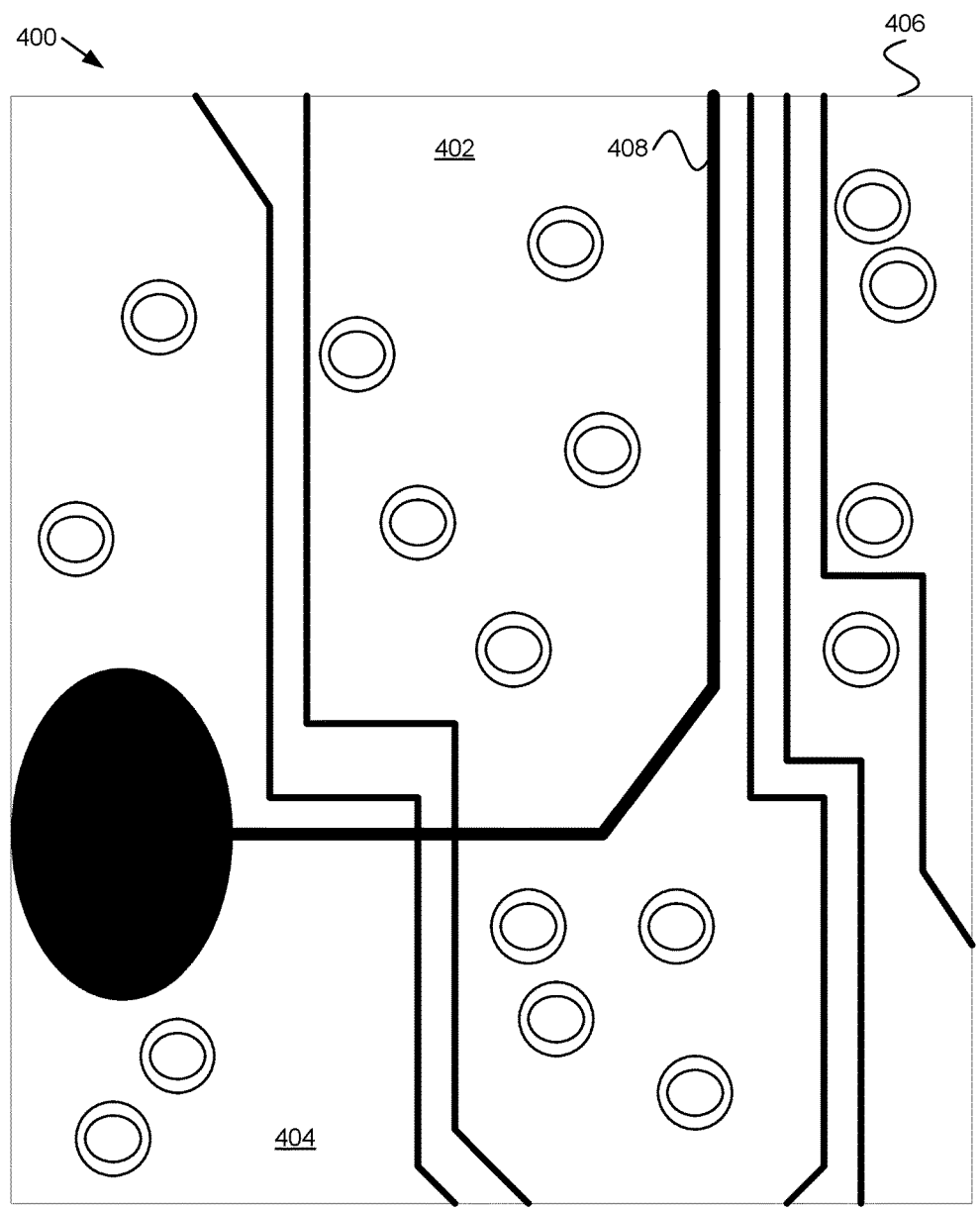
FIG. 4 is a diagram illustrating a portion of a PCB design to show non-limiting examples of operations to detect a PCB design violation on the PCB design.

The following examples with reference to FIG. 4 may be useful in understanding the various concepts and/or embodiments presented herein for detecting a design violation in a portion of a PCB design 400. However, the various concepts and/or embodiments are not limited to such examples.

Example 1: a PCB design includes a first layer 402 including a first reference voltage, a second layer 404 including a second reference voltage, a third layer 406 (e.g., a trace layer) for including a set of traces (and/or a bus) therein between the first and second layers 402 and 404, and voids 408 separating the first, second, and third layers 402, 404, and 406. While a user is adding a trace or bus to the third layer 406, a tracking module 208 tracks and/or determines the position of an UI 106 (e.g., a cursor). As the cursor adds the trace(s)/bus on the third layer 406, an analysis module 202 analyzes the position(s)/location(s) where the trace/bus is/are being added to determine if the position(s)/location(s) include a voltage, air, a non-conductive material, and/or a material without a voltage property.

In response to the analysis module 202 determining that one or more positions/locations where the trace(s)/bus is being added (via the location of the cursor) includes a voltage, an identification module 204 identifies and/or determines that a reference voltage violation is occurring since the third layer 406 is should not include a voltage. In other words, the third layer 406 is drawing voltage from first layer 402 and/or 404 when it should not be, which can result in a design failure. In response, a notification module 306 can visually, audibly, and/or tactilely notify the user of the reference voltage violation in real time, after which the user is able to make a design correction based thereon.

Similarly, in response to the analysis module 202 determining that one or more positions/locations where the trace(s)/bus is being placed (via the location of the cursor) includes air, a non-conductive material, and/or a material without a conductive property, an identification module 204 identifies and/or determines that a void violation is occurring since a trace/bus is not supposed to extend into, through, and/or over a void into another first layer 402 and/or 404 when it should not be, which can result in a design failure. In response, a notification module 206 can visually, audibly, and/or tactilely notify the user of the void violation in real time, after which the user is able to make a design correction based thereon.

Example 2: a PCB design includes a first layer 402, a second layer 404, and a third layer 406 including a set of traces (and/or a bus) between the first and second layers 402 and 404. While a user is adding a reference voltage to the first layer 402 and/or to the second layer 404, an analysis module 202 analyzes the position(s)/location(s) where the trace(s)/bus have been placed to determine if the position(s)/location(s) include a voltage, air, a non-conductive material, and/or a material without a voltage property.

In response to the analysis module 202 determining that one or more positions/locations where the trace(s)/bus is/are placed includes a voltage, an identification module 204 identifies and/or determines that a reference voltage violation is present. In response, a notification module 206 can visually, audibly, and/or tactilely notify the user of the reference voltage violation in real time, after which the user is able to make a design correction based thereon.

Similarly, in response to the analysis module 202 determining that one or more positions/locations where the trace/bus is/are placed includes air, a non-conductive material, and/or a material without a voltage property, an identification module 204 identifies and/or determines that a void violation is present. In response, a notification module 206 can visually, audibly, and/or tactilely notify the user of the void violation in real time, after which the user is able to make a design correction based thereon.

Figure 5:
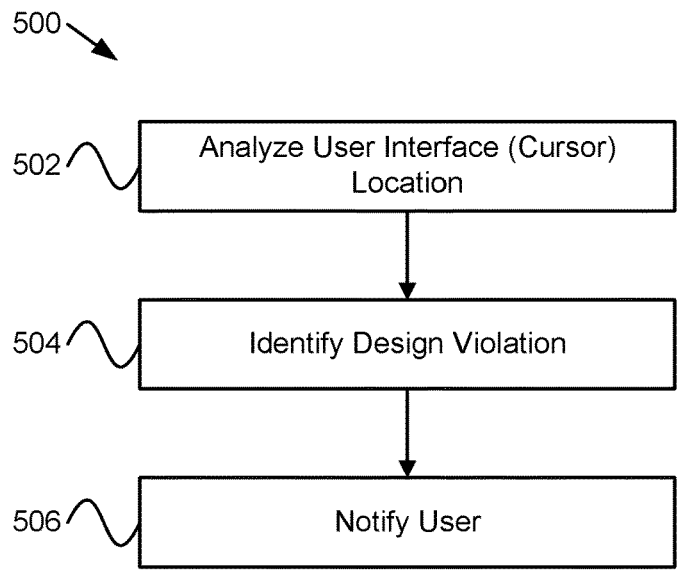
FIG. 5 is a flow diagram illustrating one embodiment of a method for detecting design violations in a PCB design.

Referring to FIG. 5, a flow diagram of one embodiment of a method 500 for detecting PCB design violations is presented. At least in the illustrated embodiment, the method 500 begins and analyzes 502 a position/location of an UI 106 (e.g., a cursor) to determine one or more characteristics of the position/location. The one or more determined characteristic may be any of the characteristics for a position/location, as set forth elsewhere herein.

The method 500 identifies 504 a design violation in the PCB design based on the analysis of the position/location. The design violation, in some embodiments, may be identified 504 in real time during the creation of a PCB design and may include identification 504 of a void violation and/or a reference voltage violation, as discussed elsewhere herein.

In response to the method 500 identifying 504 a design violation, the method 500 notifies 506 a user of the design violation and/or the location of the design violation. The method 500 may notify 506 the user using any suitable visual, audible, and/or tactile mechanism that is known or developed in the future, as discussed elsewhere herein. In some embodiments, the method 500 may be performed in real time. In some embodiments, all or portions of the method 500 are performed using one or more of the analysis module 202, the identification module 204, and the notification module 206.

Figure 6:
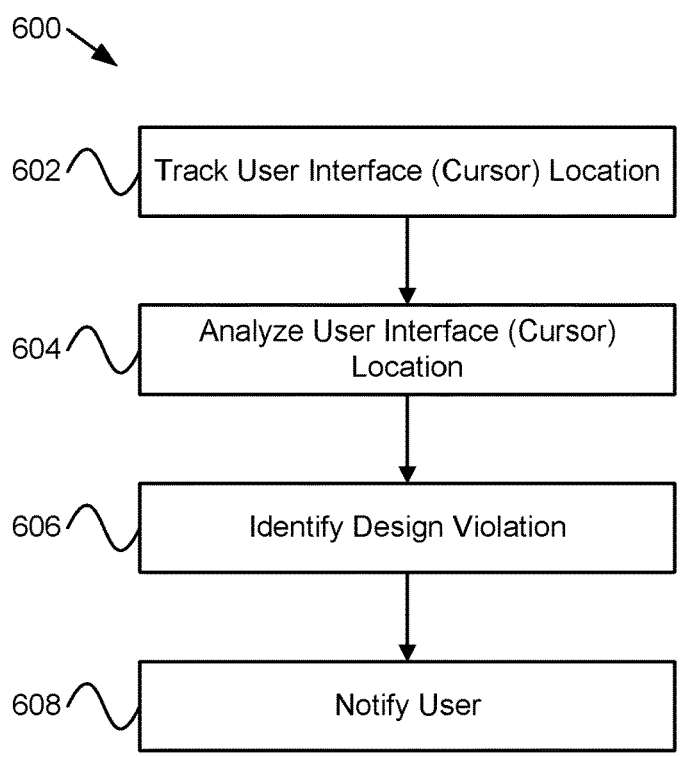
FIG. 6 is a flow diagram illustrating another embodiment of a method for detecting design violations in a PCB design.

With reference to FIG. 6, a flow diagram of another embodiment of a method 600 for detecting PCB design violations is presented. At least in the illustrated embodiment, the method 600 begins and tracks 602 the position/location of a UI 106 (e.g., a cursor) during design of a PCB to assist in locating the current position of a trace being added to the PCB design. The method 600 analyzes 604 the position(s)/location(s) of the cursor to determine one or more characteristics of the position/location. The one or more determined characteristics may be any of the characteristics for a position/location, as set forth elsewhere herein.

The method 600 identifies 606 a design violation in the PCB design based on the analysis 604 of the position(s)/location(s). The design violation, in some embodiments, may be identified in real time during design and may include a void violation and/or a reference voltage violation, as discussed elsewhere herein.

In response to the method 600 identifying 606 a design violation, the method 600 notifies 608 a user of the design violation and/or the location of each design violation. The user may be notified 608 using any suitable visual, audible, and/or tactile mechanism that is known or developed in the future, as discussed elsewhere herein. In some embodiments, the method 600 may be performed in real time. In some embodiments, all or portions of the method 600 are performed using one or more of the analysis module 202, the identification module 204, the notification module 206, and the tracking module 208.

Figure 7:
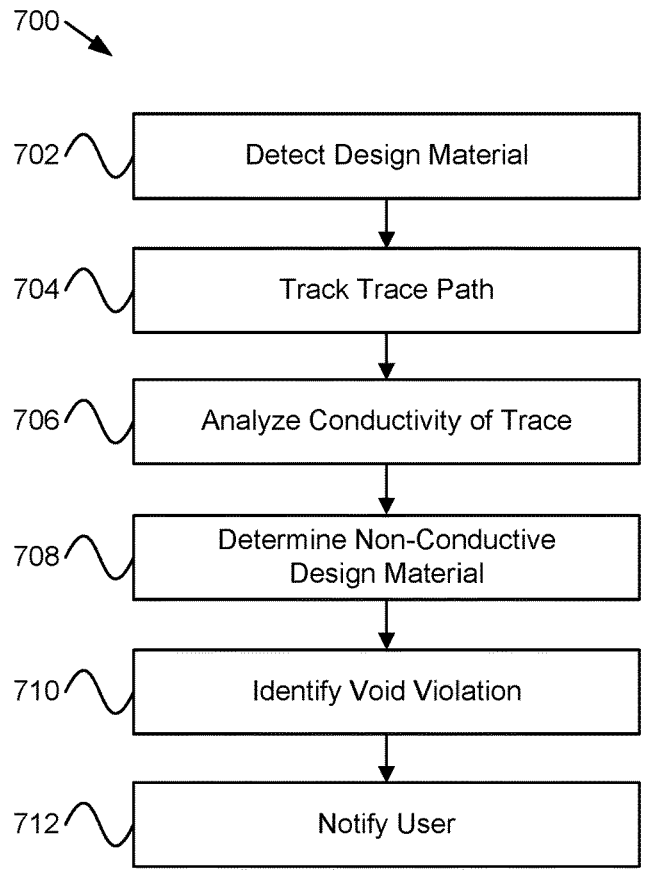
FIG. 7 is a flow diagram illustrating one embodiment of a method for detecting void violations in a PCB design.

Referring now to FIG. 7, a flow diagram of one embodiment of a method 700 for detecting a void violation on a PCB design is presented. The method 700 begins and detects 702 a user adding a design material and/or a conductivity property to a design material subsequent to a trace and/or bus being added to the PCB design.

The method 700 tracks and/or determines 704 the path of the trace on a trace layer (e.g., the third layer 406). The method 700 analyzes 706 the conductivity of the trace at the positions and/or locations along the path to detect 708 that the design material is non-conductive. In response to the method 700 detecting 708 non-conductive design material along the path, the method 700 identifies 710 a reference voltage violation at each position, location, and/or point along trace that is over a non-conductive material (e.g., a void 408).

The method 700 notifies 712 a user of each reference voltage violation and/or the location of each reference voltage violation. In some embodiments, the method 700 may be performed in real time during design of the PCB. In some embodiments, all or portions of the method 700 are performed using one or more of the analysis module 202, the identification module 204, the notification module 206, and the tracking module 208.

Figure 8:
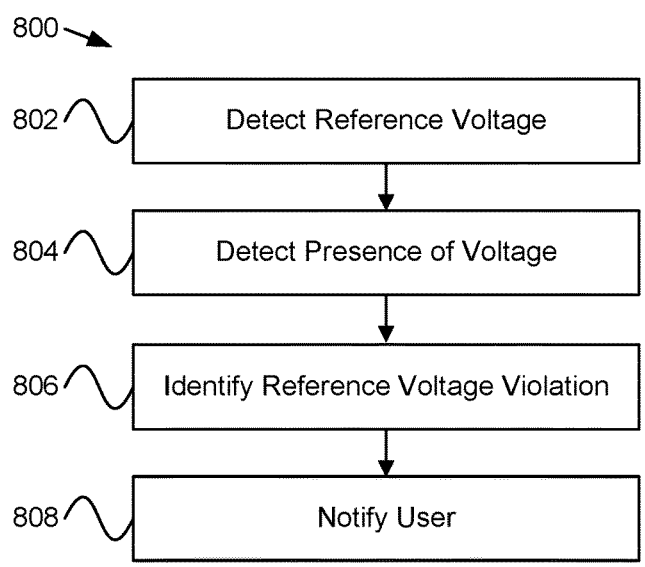
FIG. 8 is a flow diagram illustrating one embodiment of a method for detecting reference voltage violations in a PCB design.

With reference to FIG. 8, a flow diagram of one embodiment of a method 800 for detecting a reference voltage violation on a PCB design is presented. The method 800 begins by detecting 802 a user adding a reference voltage to one or more layers (e.g., the first layer 402 and/or the second layer 404) adjacent to a trace/bus layer (e.g., the third layer 406) and/or adding a voltage layer including a reference voltage, and the method 800 detects/determines 802 that one or more positions, locations, and/or paths along which a trace and/or bus is added include(s) a voltage. In response to detecting a voltage, the method 800 identifies 804 a reference voltage violation at each position, location, and/or point along the trace/bus that includes the reference voltage violation.

The method 800 then notifies 806 a user of each reference voltage violation and/or the location of each reference voltage violation. In some embodiments, all or a portion of the method 800 may be performed in real time during design of the PCB. In some embodiments, all or portions of the method 800 are performed using one or more of the analysis module 202, the identification module 204, the notification module 206 and the tracking module 208.

Figure 9:
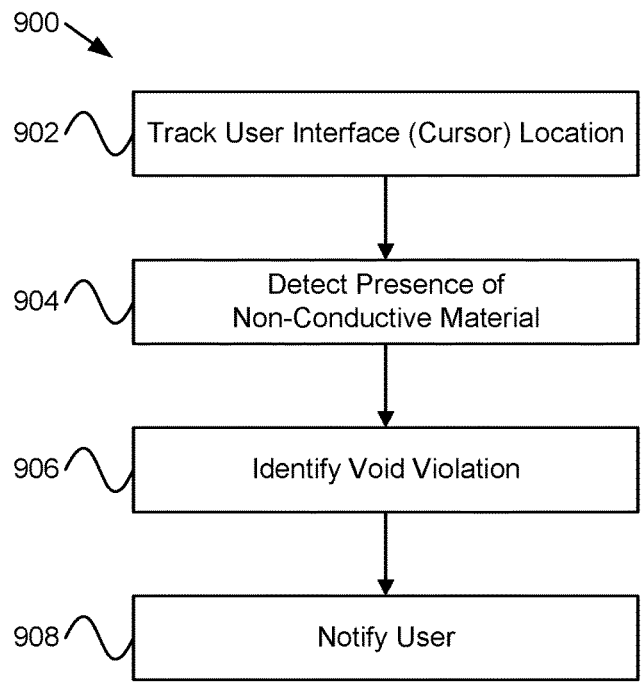
FIG. 9 is a flow diagram illustrating another embodiment of a method for detecting void violations in a PCB design.

Referring to FIG. 9, a flow diagram of another embodiment of a method 900 for detecting a void violation on a PCB design is presented. The method 900 begins and tracks and/or determines 902 the position and/or location of an UI 106 (e.g., a cursor) as it adds one or more traces and/or buses to a trace/bus layer (e.g., the third layer 406) separated from one or more layers (e.g., the first layer 402 and/or the second layer 404) by a void (e.g., void(s) 408) to assist in locating the position of the trace(s) and/or bus/buses.

The method 900 detects 904 whether positions, locations, and/or paths along which a trace and/or bus is added include(s) a non-conductive material or a material lacking an electrical property (e.g., air, glass, etc.). In response to the method 900 detecting 904 the non-conductive material, the method 900 identifies 906 a void violation at each position, location, and/or point along the trace/bus that includes a non-conductive material (or gap, air, etc.).

The method 900 notifies 908 a user of each void violation and/or the location of each void violation. In some embodiments, all or a portion of the method 900 may be performed in real time during design of the PCB. In some embodiments, all or portions of the method 900 are performed using one or more of the analysis module 202, the identification module 204, the notification module 206, and the tracking module 208.

Figure 10:
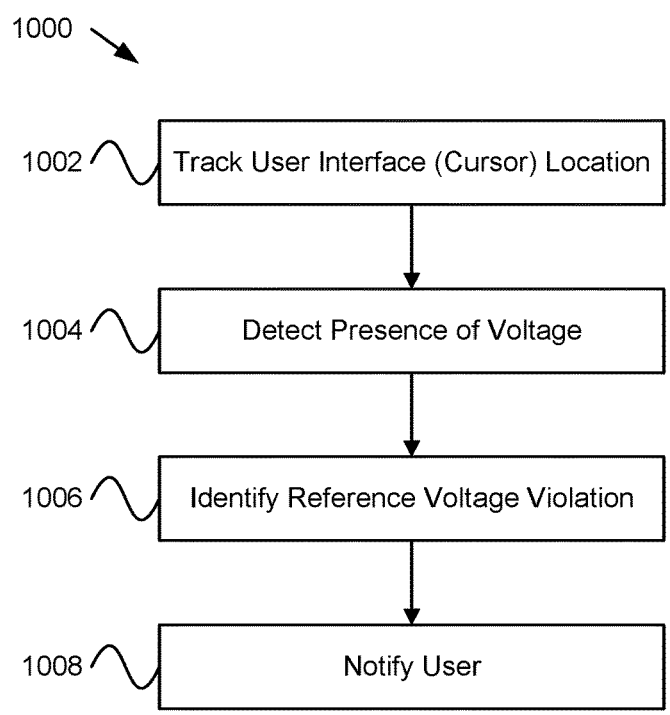
FIG. 10 is a flow diagram illustrating another embodiment of a method for detecting reference voltage violations in a PCB design.

With reference to FIG. 10, a flow diagram of another embodiment of a method 1000 for detecting a reference voltage violation on a PCB design is presented. The method 1000 begins and tracks and/or determines 1002 the position and/or location of an UI 106 (e.g., a cursor) as it adds one or more traces and/or buses to a trace/bus layer (e.g., the third layer 406) separated from one or more layers (e.g., the first layer 402 and/or the second layer 404) that include reference voltage to assist in locating the position of the trace(s) and/or bus/buses.

The method 1000 detects 1004 whether positions, locations, and/or paths along which a trace and/or bus is added include(s) a voltage. In response to the method 1000 detecting 1004 the voltage, the method 1000 identifies 1006 a reference voltage violation at each position, location, and/or point along the trace/bus that includes the voltage.

The method 1000 notifies 1008 a user of each void violation and/or the location of each void violation. In some embodiments, all or a portion of the method 1000 may be performed in real time during design of the PCB. In some embodiments, all or portions of the method 1000 are performed using one or more of the analysis module 202, the identification module 204, the notification module 206, and the tracking module 208.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus, comprising:
an analysis module that analyzes a position of a trace on a printed circuit board ("PCB") design to determine one of a conductivity of a design material over which the trace is being added and an electrical property of the trace at the position;
a tracking module that tracks a path of the trace in real time while a cursor is adding the trace during design of the PCB to enable the analysis module to determine the position of the trace;
an identification module that identifies, in real time, at least one of:
a void violation on the PCB design in response to the design material including a non-conductive material, and
a reference voltage violation on the PCB design in response to the position including a voltage; and
a notification module that notifies a user, in real time, at least one of the void violation and the reference voltage violation,
wherein at least a portion of said modules comprise one or more of hardware circuits, a programmable hardware device, and executable code stored on one or more non-transitory computer-readable storage media.

2. The apparatus of claim 1, a wherein the tracking module further tracks a path of the trace subsequent to one of a first voltage layer including a reference voltage being added to the PCB design and a reference voltage being assigned to a second voltage layer, wherein:
the analyzed position is on the path of the trace;
the electrical property at the analyzed position is a presence of a voltage; and
the identification module identifies the reference voltage violation in response to the analysis module detecting the presence of the reference voltage at the analyzed position.

3. The apparatus of claim 1, wherein the tracking module further tracks a path of the trace subsequent to one of the design material being added to the PCB design and a conductive property being assigned to the design material, wherein:
the analyzed position is on the path of the trace;
the electrical property at the analyzed position includes electrical conductivity; and
the identification module identifies the void violation in response to the analysis module detecting that the design material is non-conductive at the analyzed position.

4. The apparatus of claim 1, wherein:
the position of the trace is analyzed in real time while the cursor is adding the trace to the PCB design;
the PCB design comprises a plurality of layers and one or more voids, wherein a void separates each respective pair of layers on the PCB design; and
the analysis module analyzes the position of the trace with respect to at least one of a pair of layers that are adjacent to the position of the trace and the one or more voids.

5. The apparatus of claim 4, wherein the position of the trace is a three-dimensional ("3D") location on the PCB design.

6. The apparatus of claim 5, wherein:
one layer of the plurality of layers, in its entirety, includes a Z coordinate in the 3D location; and
an X-Y coordinate at the 3D location is determined with respect to all layers of the plurality of layers.

7. The apparatus of claim 1, wherein:
the position of the trace is analyzed in real time while the cursor is adding the trace to the PCB design;
the PCB design comprises a set of voids; and
the identification module identifies the void violation in response to the analysis module analyzing the position of the trace to determine that the trace is located in a void.

8. The apparatus of claim 1, wherein:
the position of the trace is analyzed in real time while the cursor is adding the trace to the PCB design;
the PCB design comprises:
a first layer including a reference voltage,
a second layer including a set of traces, and
a void separating the first layer and the second layer; and
the identification module identifies the void violation in response to the analysis module analyzing the position of the trace to determine that the trace is located in the void.

9. The apparatus of claim 1, wherein:
the position of the trace is analyzed in real time while the cursor is adding the trace to the PCB design;
the PCB design comprises a plurality of layers;
one or more layers of the plurality of layers include a reference voltage; and
the identification module identifies the reference voltage violation in response to the analysis module analyzing the position of the trace to determine that the position of the trace includes a same voltage as an adjacent layer on the PCB design.

10. The apparatus of claim 1, wherein:
the position of the trace is analyzed in real time while the cursor is adding the trace to the PCB design;
the PCB design comprises:
a first layer including a first reference voltage,
a second layer including a second reference voltage, and
a third layer between the first layer and the second layer, the third layer including a set of traces;
the position of the trace is located on the third layer;
the analysis module analyzes the position of the trace to determine that the position of the trace includes one of the first reference voltage and the second reference voltage; and
the identification module identifies the reference voltage violation in response to a determination result obtained in analyzing the position of the trace by the analysis module.

11. The apparatus of claim 1, wherein:
the position of the trace is analyzed in real time while the cursor is adding the trace to the PCB design;
the PCB design comprises:
a first layer including a first reference voltage,
a second layer including a second reference voltage, and
a third layer between the first layer and the second layer, the third layer including a set of traces;
the position of the trace is located on one of the first layer and the second layer;

the analysis module analyzes the position of the trace to determine that the position of the trace includes one of the first reference voltage and the second reference voltage; and the identification module identifies the reference voltage violation in response to a determination result obtained in analyzing the position of the trace by the analysis module.

12. A method, comprising:

analyzing, by a processor, a position of a trace on a printed circuit board ("PCB") design to determine one of: a conductivity of a design material over which the trace is being added and an electrical property of the trace at the position;

tracking a path of the trace in real time while a cursor is adding the trace during design of the PCB to determine the position of the trace;

identifying, in real time, at least one of:
 a void violation on the PCB design in response to the design material including a non-conductive material, and
 a reference voltage violation on the PCB design in response to the position of the trace including a voltage; and notifying a user, in real time, of the at least one of the void violation and the reference voltage violation.

13. The method of claim 12, further comprising tracking a path of the trace subsequent to one of a first voltage layer including a reference voltage being added to the PCB design and a reference voltage being assigned to a second voltage layer, wherein:

the analyzed position is on the path of the trace;
the electrical property at the analyzed position is a presence of a reference voltage; and
the reference voltage violation is identified in response to detecting the presence of the reference voltage at the analyzed position.

14. The method of claim 12, further comprising:

tracking a path of the trace subsequent to one of: the design material being added to the PCB design and a conductive property being assigned to the design material, wherein:

the analyzed position is on the path of the trace;
the electrical property at the analyzed position includes electrical conductivity; and the void violation is identified in response to detecting that the design material is non-conductive at the analyzed position.

15. The method of claim 12, wherein:
the PCB design comprises a set of voids; and
the void violation is identified in response to determining that the position of the trace is in a void.

16. The method of claim 12, wherein:
the PCB design comprises a plurality of layers;
a set of layers of the plurality of layers include a reference voltage; and
the reference voltage violation is identified in response to determining that the position of the trace includes the reference voltage of an adjacent layer.

17. The method of claim 12, wherein:
the PCB design comprises a voltage layer including a reference voltage;
the position of the trace is on the voltage layer; and
the reference voltage violation is identified in response to determining that the position of the trace includes the reference voltage.

18. A system, comprising:
a client device configured to enable a user to create a printed circuit board ("PCB") design; and
a server coupled to the client device, the server comprising:
 an analysis module that analyzes a position of a trace on the PCB design to determine one of: a conductivity of a design material over which the trace is being added and an electrical property of the trace at the position;
 a tracking module that tracks a path of the trace in real time while a cursor is adding the trace during design of the PCB to enable the analysis module to determine the position of the trace;
 an identification module that identifies, in real time, at least one of:
  a void violation on the PCB design in response to the design material including a non-conductive material, and
  a reference voltage violation on the PCB design in response to the position of the trace including a voltage, and
 a notification module that notifies the user, in real time, at least one of the void violation and the reference voltage violation.

* * * * *